(12) United States Patent
Zhou et al.

(10) Patent No.: US 9,214,528 B2
(45) Date of Patent: Dec. 15, 2015

(54) METHOD TO FABRICATE SELF-ALIGNED ISOLATION IN GALLIUM NITRIDE DEVICES AND INTEGRATED CIRCUITS

(71) Applicant: Efficient Power Conversion Corporation, El Segundo, CA (US)

(72) Inventors: Chunhua Zhou, El Segundo, CA (US); Jianjun Cao, Torrance, CA (US); Alexander Lidow, Marina Del Rey, CA (US); Robert Beach, La Crescenta, CA (US); Alana Nakata, Redondo Beach, CA (US); Robert Strittmatter, Tujunga, CA (US); Guangyuan Zhao, Torrance, CA (US); Seshadri Kolluri, San Jose, CA (US); Yanping Ma, Torrance, CA (US); Fang Chang Liu, Taiwan (TW); Ming-Kun Chiang, Hsinchu (TW); Jiali Cao, Torrance, CA (US)

(73) Assignee: Efficient Power Conversion Corporation, El Segundo, CA (US)

( * ) Notice: Subject to any disclaimer, the term of this patent is extended or adjusted under 35 U.S.C. 154(b) by 0 days.

(21) Appl. No.: 14/322,641

(22) Filed: Jul. 2, 2014

(65) Prior Publication Data

US 2015/0011057 A1  Jan. 8, 2015

Related U.S. Application Data

(60) Provisional application No. 61/843,804, filed on Jul. 8, 2013.

(51) Int. Cl.
*H01L 21/338* (2006.01)
*H01L 29/66* (2006.01)
(Continued)

(52) U.S. Cl.
CPC ...... *H01L 29/66462* (2013.01); *H01L 21/8252* (2013.01); *H01L 27/0605* (2013.01); *H01L 29/2003* (2013.01); *H01L 29/7786* (2013.01); *H01L 27/088* (2013.01)

(58) Field of Classification Search
CPC .................. H01L 29/66462; H01L 29/7787
USPC ........................................................ 438/172
See application file for complete search history.

(56) References Cited

U.S. PATENT DOCUMENTS 5,973,402 A * 10/1999 Shinriki et al. ............... 257/768
2006/0019435 A1    1/2006 Sheppard et al.
(Continued)

OTHER PUBLICATIONS

Y. Uemoto et al., "GaN Monolithic Inverter IC Using Normally-off Gate Injection Transistors with Planar Isolation on Si Substrate", Advanced Technology Research Laboratories, pp. 165-168, 2009.
(Continued)

*Primary Examiner* — Reema Patel
*Assistant Examiner* — Syed Gheyas
(74) *Attorney, Agent, or Firm* — Dickstein Shapiro LLP (57) ABSTRACT

A method for forming an enhancement mode GaN HFET device with an isolation area that is self-aligned to a contact opening or metal mask window. Advantageously, the method does not require a dedicated isolation mask and the associated process steps, thus reducing manufacturing costs. The method includes providing an EPI structure including a substrate, a buffer layer a GaN layer and a barrier layer. A dielectric layer is formed over the barrier layer and openings are formed in the dielectric layer for device contact openings and an isolation contact opening. A metal layer is then formed over the dielectric layer and a photoresist film is deposited above each of the device contact openings. The metal layer is then etched to form a metal mask window above the isolation contact opening and the barrier and GaN layer are etched at the portion that is exposed by the isolation contact opening in the dielectric layer.

22 Claims, 10 Drawing Sheets (51) Int. Cl.
*H01L 29/778* (2006.01)
*H01L 29/20* (2006.01)
*H01L 21/8252* (2006.01)
*H01L 27/06* (2006.01)
*H01L 27/088* (2006.01)

(56) References Cited

U.S. PATENT DOCUMENTS

2006/0226442 A1 10/2006 Zhang et al.
2007/0164321 A1 7/2007 Sheppard et al.
2007/0228416 A1 10/2007 Chen et al.
2010/0117188 A1 5/2010 Waldrab et al.
2010/0330754 A1 12/2010 Hebert

OTHER PUBLICATIONS

Jin-Yu Shiu et al., "Oxygen Ion Implantation Isolation Planar Process for AlGaN/GaN HEMTs", IEEE Electron Device Letters, vol. 28, No. 6, Jun. 2007, pp. 476-478.

* cited by examiner

METHOD TO FABRICATE SELF-ALIGNED ISOLATION IN GALLIUM NITRIDE DEVICES AND INTEGRATED CIRCUITS

CROSS REFERENCE TO RELATED APPLICATIONS

This application claims the benefit of U.S. Provisional Application No. 61/843,804 filed on Jul. 8, 2013, the entire contents of which are hereby incorporated by reference.

BACKGROUND OF THE INVENTION

1. Field of Invention

The present invention relates to the field of enhancement mode gallium nitride (GaN) heterojunction field effect transistors (HFET). In particular, the invention relates to methods for more cost-effective fabrication of enhancement mode GaN devices and integrated circuits.

2. Description of the Related Art

Gallium nitride (GaN) semiconductor devices are increasingly desirable for power semiconductor devices because of their ability to carry large current and support high voltages. Development of these devices has generally been aimed at high power/high frequency applications. Devices fabricated for these types of applications are based on general device structures that exhibit high electron mobility and are referred to variously as heterojunction/heterostructure field effect transistors (HFET), high electron mobility transistors (HEMT), or modulation doped field effect transistors (MODFET).

A GaN HFET device includes a nitride semiconductor with at least two nitride layers. Different materials formed on the semiconductor or on a buffer layer cause the layers to have different band gaps. The different material in the adjacent nitride layers also causes polarization, which contributes to a conductive two dimensional electron gas (2DEG) region near the junction of the two layers, specifically in the layer with the narrower band gap.

The nitride layers that cause polarization typically include a barrier layer of AlGaN adjacent to a layer of GaN to include the 2DEG, which allows charge to flow through the device. This barrier layer may be doped or undoped. Because the 2DEG region exists under the gate at zero gate bias, most nitride devices are normally on, or depletion mode devices. If the 2DEG region is depleted (i.e., removed) below the gate at zero applied gate bias, the device can be an enhancement mode device. Enhancement mode devices are normally off and are desirable because of the added safety they provide and because they are easier to control with simple, low cost drive circuits. An enhancement mode device requires a positive bias applied at the gate in order to conduct current.

Figure 1:
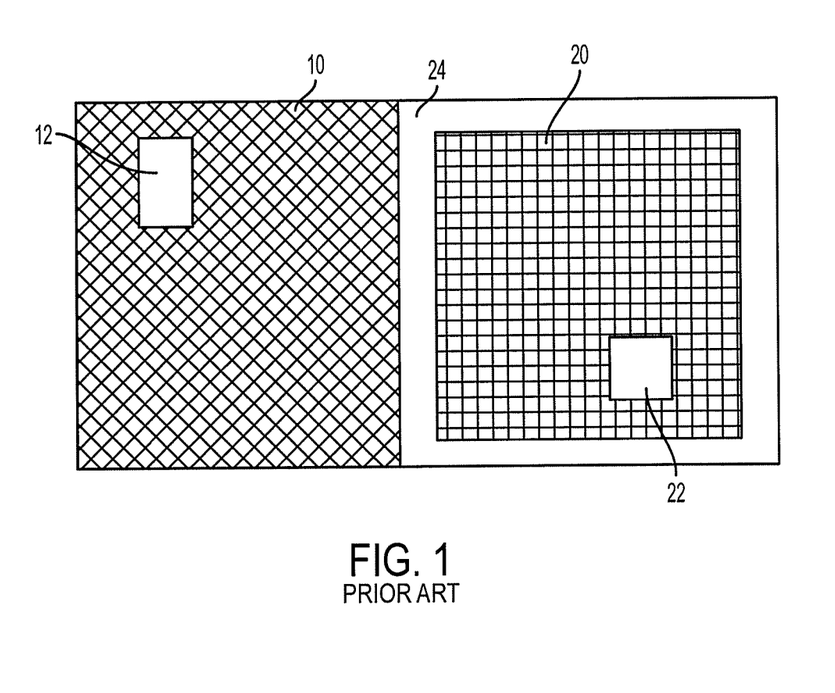
FIG. 1 schematically illustrates a top view of a conventional GaN integrated circuit having two adjacent devices each with a corresponding isolation area.

In GaN devices and integrated circuits, isolation is typically used to remove the 2DEG at a selected area. Isolation reduces parasitic capacitances, for example, gate-to-drain capacitance and drain-to-source capacitance. FIG. 1 illustrates an exemplary integrated circuit with two device 10 and 20 in which isolation area 12 in device 10 and isolation area 22 in device 20 are provided to intentionally remove the 2DEG to minimize parasitic capacitance. Isolation placed at certain areas of the devices can also reduce electric field.

In a GaN integrated circuit, isolation is used to enable different reference potentials for each device. For example, in FIG. 1, isolation area 24 electrically separates device 10 and device 20 so that the source of device 10 and the source of device 20 will be at different potentials. Isolation areas 12 and 22 inside the devices 10 and 20 remove the 2DEG where it is undesirable, thereby reducing parasitic capacitances and in some cases removing areas with higher electric field.

Figure 2:
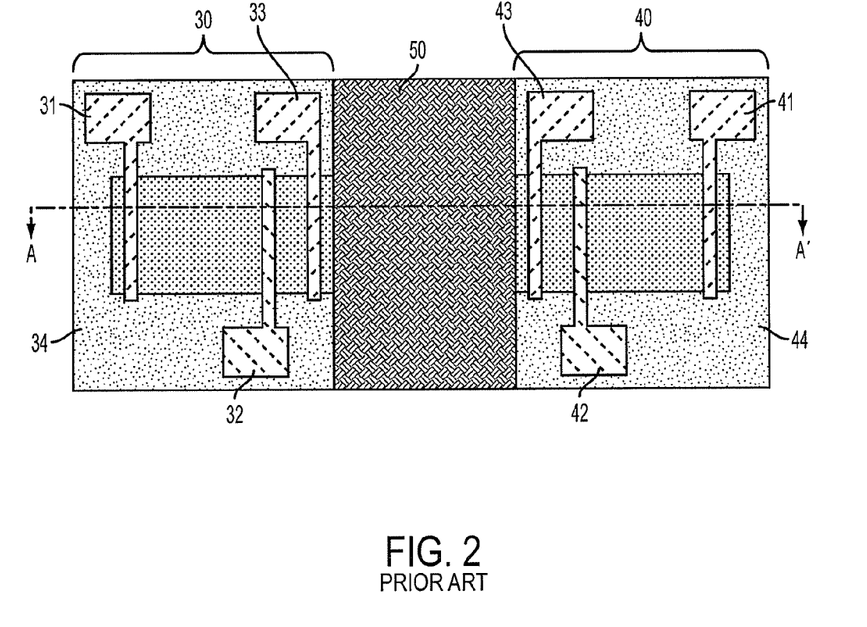
FIG. 2 schematically illustrates a top view of another conventional GaN integrated circuit having two adjacent devices each with a corresponding isolation area.

FIG. 2 illustrates another exemplary integrated circuit having device 30 and device 40 with isolation. Device 30 includes drain 31, gate 32 and source 33. Likewise, device 40 includes drain 41, gate 42 and source 43. An isolation area 50 electrically separates device 30 and device 40, so that the source 33 of device 30 and the source 43 of device 40 will be at different potentials. Device 30 includes isolation area 34 and device 40 includes isolation area 44 to remove the 2DEG where it is undesirable, thereby reducing parasitic capacitances and in some cases removing areas with higher electric field.

Figure 3A:
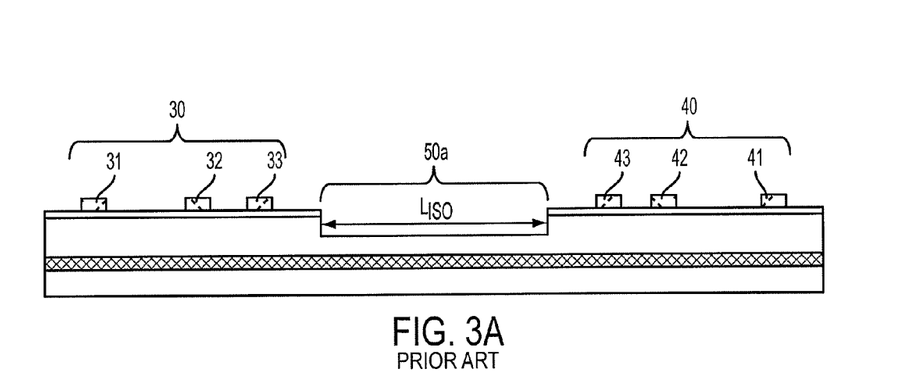
FIG. 3A illustrates a cross-sectional view of a conventional isolation area formed by etching away active layers.
Figure 3B:
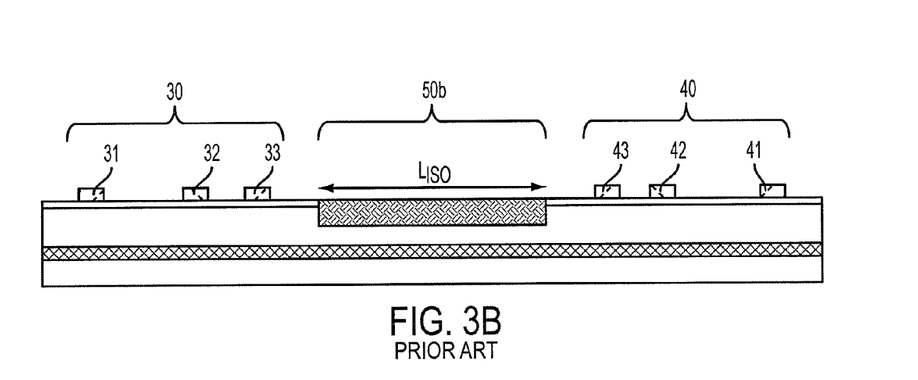
FIG. 3B illustrates a cross-sectional view of a conventional isolation area formed by implanting ions into active layers.

In conventional manufacturing methods, to fabricate isolation area 50 between adjacent devices 30 and 40 and to fabricate isolation areas 34 and 44 inside the devices 30 and 40, conductive layers and the 2DEG are removed by etching or ion-implantation. FIGS. 3A and 3B illustrate a cross-section of line AA' from FIG. 2, where the isolation area 50a, 50b is formed by said etching and said ion-implantation, respectively.

As shown FIGS. 3A and 3B, the isolation areas 50a and 50b have a length $L_{ISO}$ that determines the maximum voltage differential between the source 33 of the first device 30 and the source 43 of the second device 40. In GaN based materials, the breakdown voltage may be proportional to $L_{ISO}$ with 50–200V per μm.

Figure 4A:
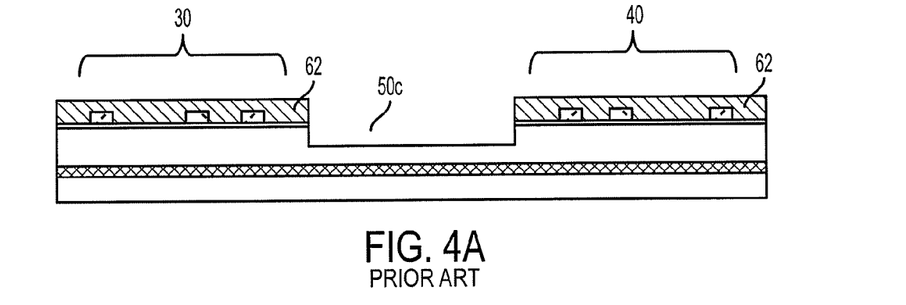
FIG. 4A illustrates a cross-sectional view of a conventional isolation area formed by etching with a dedicated mask.
Figure 4B:
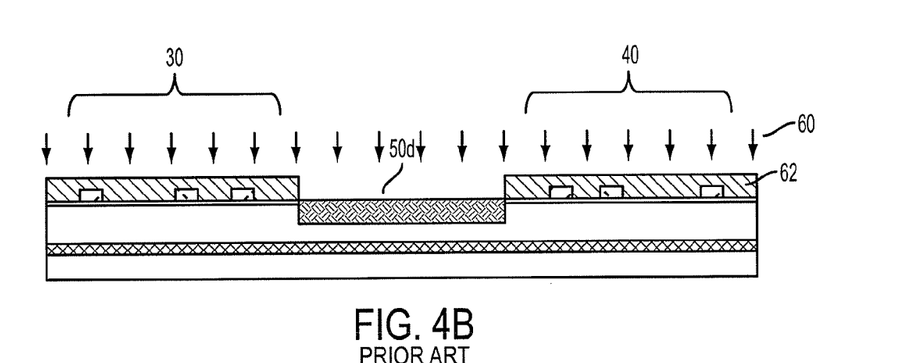
FIG. 4B illustrates a cross-sectional view of a conventional isolation area formed by ion-implantation with a dedicated mask.

Conventionally, the isolation area 50 is fabricated with a dedicated mask. As shown in FIGS. 4A and 4B, in fabricating the isolation area 50 with etching or ion-implantation 60, a dedicated isolation mask is used to form a patterned photoresist 62 on top of the wafer. The isolation areas 50c and 50d are exposed while the device regions of device 30 and device 40 are covered with the patterned photoresist 62.

Conventional manufacturing methods to form the isolation area 50 includes several process steps, including, for example, photolithography, etch or ion-implantation, photoresist strip, and wafer cleaning. Ion-implantation isolation may additionally require a thermal anneal to active the implanted ion species. A dedicated isolation mask and its associated process steps increase fabrication cost.

Accordingly, there is a strong felt need for a manufacturing method of GaN semiconductor devices that forms an isolation area, with a self-aligned isolation region, that avoids the above-mentioned disadvantages and additional process steps.

SUMMARY OF THE INVENTION

Embodiments described below address the problems discussed above and other problems, by providing manufacturing method of GaN semiconductor devices that forms a self-aligned isolation region.

The method includes providing an EPI structure including a substrate, a buffer layer a GaN layer and a barrier layer. A dielectric layer is formed over the barrier layer and openings are formed in the dielectric layer for ohmic contacts and a contact opening. A metal layer is then formed over the dielectric layer and a photoresist film is deposited above each of the ohmic contact openings. The metal layer is then etched to form a metal mask window above the contact opening and the barrier layer and GaN layer are etched at the portion that is exposed by the contact opening in the dielectric layer.

BRIEF DESCRIPTION OF THE DRAWINGS

The features, objects, and advantages of the present disclosure will become more apparent from the detailed description set forth below when taken in conjunction with the drawings in which like reference characters identify correspondingly elements and in which.

The figures are not necessarily drawn to scale and the elements of similar structures or functions are generally represented by like reference numerals for illustrative purposes throughout the figures. The figures are only intended to facilitate the description of the various embodiments described herein; the figures do not describe every aspect of the teachings disclosed herein and do not limit the scope of the claims.

DETAILED DESCRIPTION OF THE PREFERRED EMBODIMENT

In the following detailed description, reference is made to certain embodiments. This detailed description is merely intended to teach a person of skill in the art further details for practicing preferred aspects of the present teachings and is not intended to limit the scope of the claims. Therefore, combinations of features disclosed in the following detailed description may not be necessary to practice the teachings in the broadest sense, and are instead taught merely to describe particularly representative examples of the present teachings. It is to be understood that other embodiments may be employed and that various structural, logical, and electrical changes may be made.

The present invention is a method for forming an enhancement mode GaN HFET device with an isolation area that is self-aligned to a contact opening or metal mask window. Advantageously, the method does not require a dedicated isolation mask and the associated process steps, thus reducing manufacturing costs.

Figure 5:
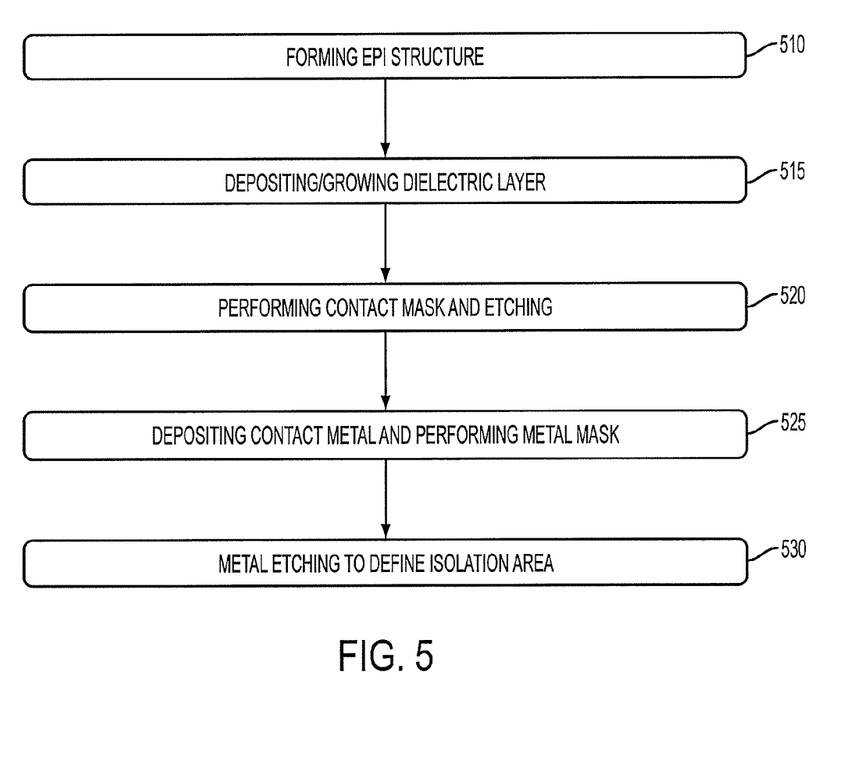
FIG. 5 illustrates a flow chart to fabricate self-aligned isolation areas according to an example embodiment of the present invention.

FIG. 5 illustrates a flowchart of a method for manufacturing a GaN HFET with an isolation area according to a first embodiment of the present invention. Initially, at Step 510, an as-grown EPI structure is formed. As will be discussed in more detail below, the EPI structure includes a substrate, a buffer layer, a gallium nitride (GaN) layer 13 and an AlGaN barrier layer. At Step 515, a dielectric layer is deposited over the EPI surface. It should be appreciated that the deposition can be performed using any conventional deposition technique, such as atomic layer deposition or plasma enhanced chemical vapor deposition or the like. Alternatively, the dielectric layer can be grown at the end of the EPI growth.

Next, at Step 520, a contact mask is deposited on the dielectric layer and etching is performed to define windows in the dielectric layer where the ohmic contacts are to be formed for the active devices and where the isolation areas are to be formed. After etching, a contact metal is blanket deposited and a metal mask is performed at Step 525. The metal mask defines where metal lines and spaces are provided for the active devices and where the open areas for the isolation area are to be formed.

Finally, at Step 530, a metal etch is performed to etch away the metal where the metal mask has open areas and to etch away conductive layers where the isolation area is to be formed. During the metal over etching at Step 530, the etching stops at the metal mask or the dielectric layer in the active device regions. In contrast, in regions with both open areas in the metal mask and open windows in the contact mask, metal over etching will continue to etch away conductive layers to form the isolation area. The contact metal mask and metal etch can be used to form the drain and source ohmic contacts. Alternatively, the contact metal mask and metal etch can be used for the formation of a gate contact. The resulting GaN HFET includes an isolation area that is self-aligned to a contact opening or metal mask window.

FIGS. 6A-6G illustrate cross sectional views of selected process steps for forming an enhancement mode GaN HFET device with an isolation area that is self-aligned to a contact opening or metal mask window. The cross sectional views in the figures are generally taken in a plane perpendicular to the wafer surface and like reference numbers are used consistently for like features throughout the drawings. It should be appreciated that the cross sectional views generally correspond to the method steps described above with respect to FIG. 5.

Figure 6A:
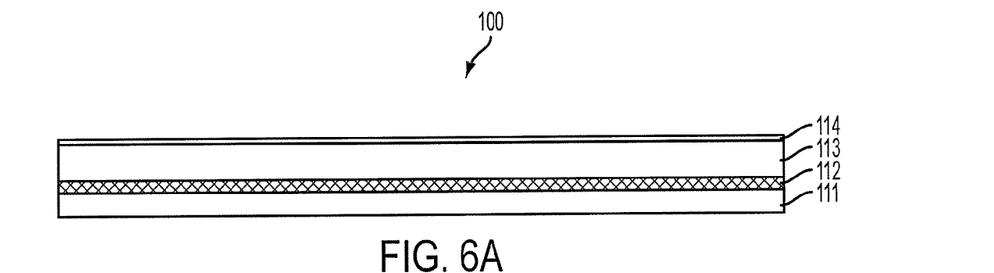
FIGS. 6A-6G illustrate example process steps according to one embodiment of the present invention.

FIG. 6A illustrates the starting EPI structure 100. From bottom to top, EPI structure 100 includes a substrate 111 such as silicon, silicon carbide, GaN, and sapphire, a buffer layer 112, a GaN layer 113 that is typically un-doped and preferably between 0.5 and 10 μm thick, and an AlGaN barrier layer 114 that is typically un-doped, preferably between 50 Å to 300 Å thick, and with the Al composition comprising preferably between 10% and 35% of the AlGaN barrier layer 114. Each of the layers of EPI structure 100 can be deposited or otherwise formed over substrate 111 using conventional deposition techniques as would be understood to one skilled in the art.

Figure 6B:
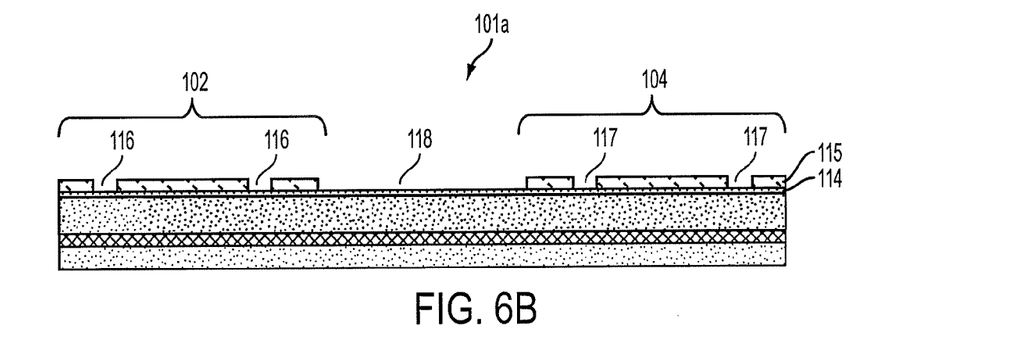

FIG. 6B illustrates the resulting GaN structure 101a once a dielectric layer is deposited on EPI structure 100 (i.e., Step 515 of FIG. 5). As shown, a dielectric layer 115 is deposited on the AlGaN barrier layer 114 of EPI structure 100. Preferably, the dielectric layer 115 is silicon nitride ($Si_3N_4$). After the dielectric material 115 has been deposited, a contact mask and etch (i.e., Step 520 of FIG. 5) is performed to define the areas where contacts 116 for device 102 and contacts 117 for device 104 are to form. As will be discussed in more detail below, the isolation area will be formed at the contact opening 118.

Figure 6C:
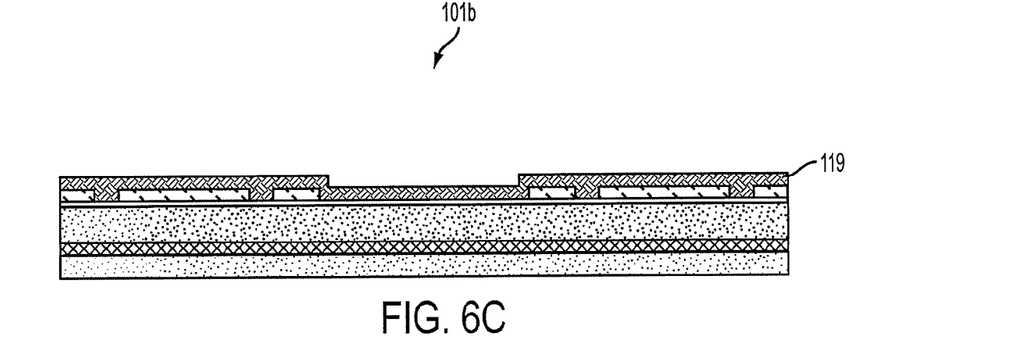

FIG. 6C illustrates the resulting GaN structure 101b after deposition of a metal layer 119 (i.e., Step 525 of FIG. 5). Preferably, the metal layer 119 is a metal film that, for example, can be made of a stack of Titanium (Ti), Aluminum (Al), and Molybdenum (Mo). As shown, the metal layer 119 is deposited over the dielectric layer 115 and also in the openings for contacts 116 and 117 as well as in contact opening 118.

Figure 6D:
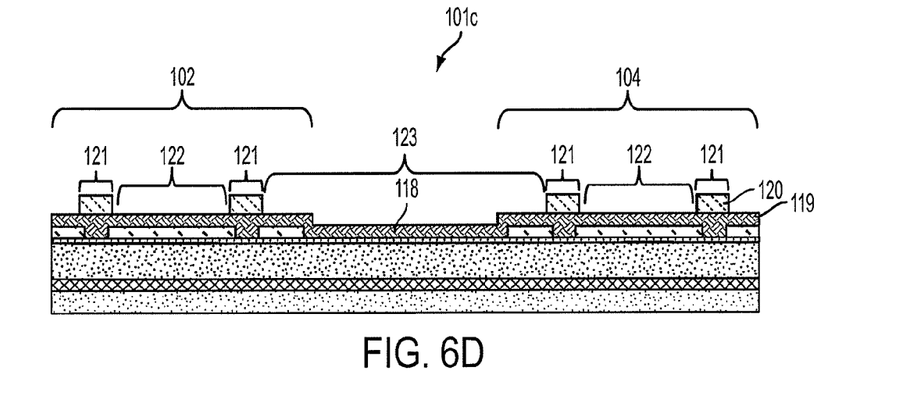

Next, FIG. 6D illustrates the GaN structure 101c after the metal mask is performed. The metal mask defines a photoresist film 120, metal lines 121 in the active devices 102 and 104, and metal spaces 122 in the active devices 102 and 104. Further, a metal mask window 123 is formed for the isolation area between the two active devices 102 and 104. Preferably, the dimension of the metal mask window 123 is wider than the contact opening 118 illustrated in FIG. 6B.

Figure 6E:
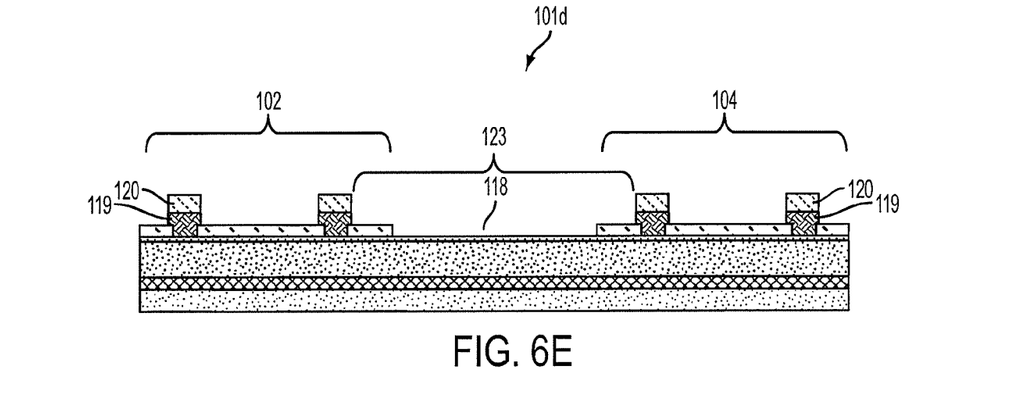

FIG. 6E illustrates the GaN structure 101d after metal etching removes the metal layer 119 on surfaces of the structure where the photoresist 120 is not formed. In the exemplary embodiment, the metal etching preferably uses $Cl_2$, $BCl_3$, and Ar plasma. As similarly illustrated in FIG. 6D, a metal mask window 123 is provided where the isolation area between the two devices 102 and 104 is to be formed, with the metal mask window 123 preferably wider than contact opening 118.

Figure 6F:
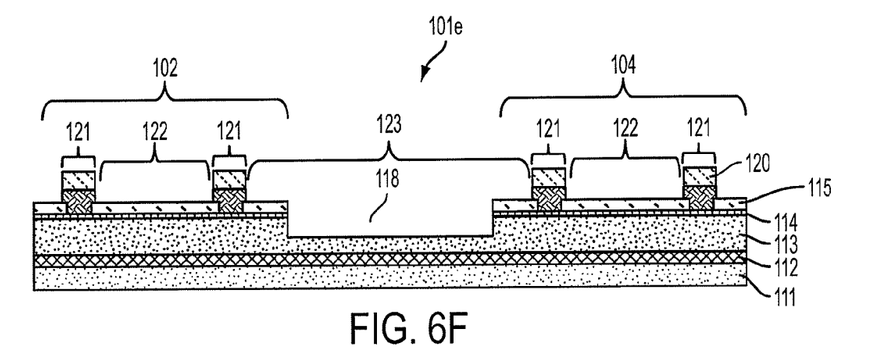

FIG. 6F illustrates the GaN structure 101e after the conductive layers have been removed in metal over etching. During metal over etch, the metal etching stops at the photoresist 120 in metal lines 121. The etching also stops at dielectric layer 115 in metal spaces 122 and metal lines 121 outside of the contact opening 118. In the exemplary embodiment, only in regions where metal mask window 123 and contact opening 118 overlap, metal over etching will continue to etch away the AlGaN barrier 114 and into the GaN layer 113. The etching into GaN layer 113 removes the 2DEG to form the isolation area.

As noted above, in the exemplary embodiment, the metal mask window 123 is larger than the contact opening 118, which makes the isolation area between the two devices 102 and 104 preferably the same size as the contact opening 118 created in Step 520 of FIG. 5 and illustrated in FIG. 6B. As such, the isolation area between the two devices 102 and 104 is self-aligned to the contact opening 118, which results in the structure 101e shown in FIG. 6F. It should be appreciated that in an alternative embodiment, the contact opening 118 may be larger than the metal mask window 123, which would result in the isolation area being self-aligned to the metal mask window 123.

Figure 6G:
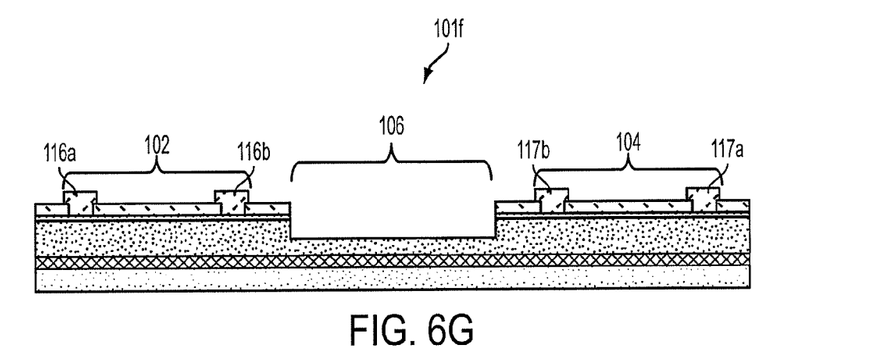

FIG. 6G illustrates the final GaN structure 101f after the photoresist 120 is stripped using conventional techniques. The isolation area 106 between the two devices 102 and 104 has been formed in metal over etching. As shown, device 102 includes a pair of ohmic contacts 116a, 116b (i.e., drain and source contacts) and device 104 likewise includes a pair of ohmic contacts 117a, 117b (i.e., drain and source contacts). Advantageously, the manufacturing process described herein defines the isolation area without using a dedicated mask and the associated process steps, thereby significantly reducing fabrication costs.

Figure 7A:
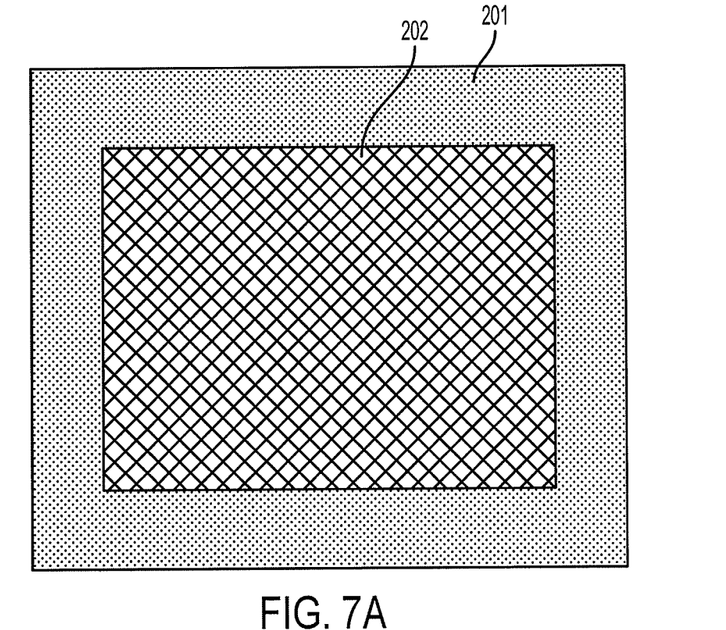
FIGS. 7A-7B illustrate a top view and cross-sectional view of an exemplary embodiment of the present invention with a formed isolation area that is self-aligned to a metal mask window.
Figure 7B:
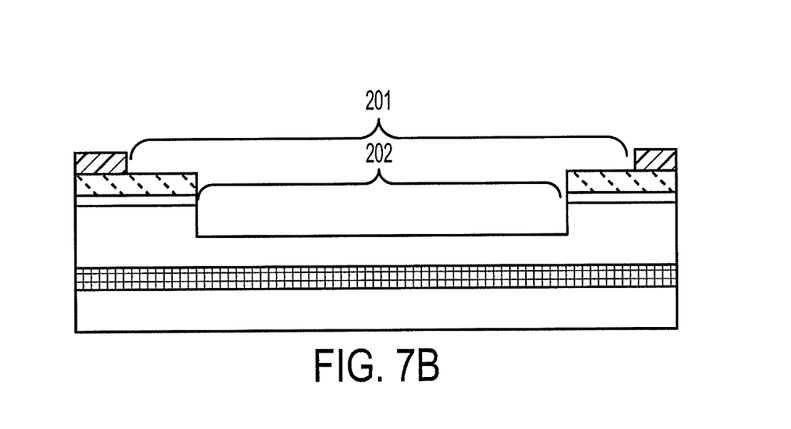

FIGS. 7A-7D illustrate schematic cross sections of the self-aligned isolation structure where the metal mask window and the contact opening overlap. In particular, FIGS. 7A-7B illustrate a top view and cross-sectional view of an embodiment of the present invention in which the contact opening is larger than the metal mask window. As shown in FIG. 7A, the metal mask opening 201 is larger than the contact opening 202. As a result, the isolation area is preferably self-aligned to the contact opening 202 as depicted in the schematic cross section shown in FIG. 7B. It should be appreciated that this embodiment can be implemented using the inventive process steps discussed above.

Figure 7C:
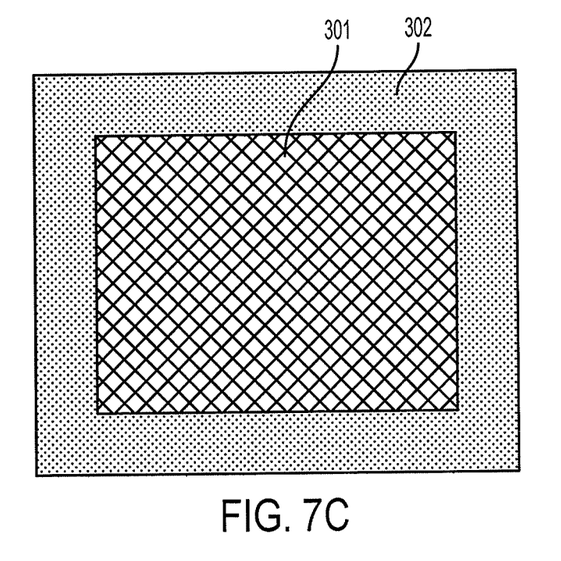
FIGS. 7C-7D illustrate a top view and cross-sectional view of an exemplary embodiment of the present invention with a formed isolation area that is self-aligned to a contact opening.
Figure 7D:
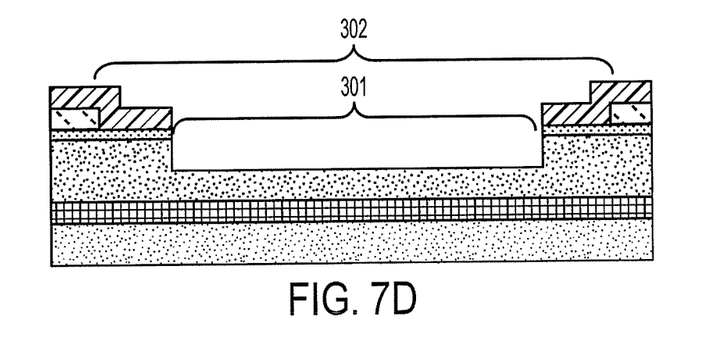

FIGS. 7C-7D illustrate a top view and cross-sectional view of another embodiment of the present invention in which the contact opening is smaller than the metal mask window. As shown in FIG. 7C, metal mask window 301 is smaller than the contact opening 302. As a result, the isolation area will be self-aligned to the metal mask window 301 as depicted in the schematic cross section shown in FIG. 7D.

Finally, it is noted that while the foregoing manufacturing method described above with respect to FIGS. 5 and 6A-6G has been described to manufacture an integrated circuit having two or more transistor devices, it is contemplated that the manufacturing method described herein can also be implemented to fabricate a discrete transistor device or the like. Namely, in one exemplary application, the disclosed manufacturing technique can be applied to form an isolation region under a gate pad of a transistor or the like. Another example would be using the inventive manufacturing method to form an isolation mesa in a single device as would be appreciate to those skilled in the art.

The above description and drawings are only to be considered illustrative of specific embodiments, which achieve the features and advantages described herein. Modifications and substitutions to specific process conditions may be made. Accordingly, the embodiments of the invention are not considered as being limited by the foregoing description and drawings.

What is claimed is:

1. A method of forming an integrated circuit having at least two transistor devices, the method comprising:
    forming a buffer layer on a substrate;
    forming a GaN layer over the buffer layer;
    forming a barrier layer over the GaN layer;
    forming a dielectric layer over the barrier layer;
    forming at least one device contact opening in the dielectric layer for each of the at least two transistor devices and an isolation contact opening in the dielectric layer between the at least two transistor devices;
    forming a metal layer over the dielectric layer, the device contact openings and the isolation contact opening;
    forming a photoresist film above each of the device contact openings, the photoresist film defining a metal mask window;
    etching the metal layer and, as part of the same metal layer etching step,
    etching a portion of the barrier layer and the GaN layer to form an isolation region where the metal mask window and isolation contact opening overlap.

2. The method of claim 1, wherein the isolation contact opening is wider than the metal mask window.

3. The method of claim 1, wherein the metal mask window is wider than the isolation contact opening.

4. The method of claim 1, where the step of etching the metal layer comprises metal etching using a plasma comprising at least one of a Cl2, BCl3, and Ar plasma.

5. The method of claim 1, where the step of forming the device contact openings and the isolation contact opening in the dielectric layer comprises etching the dielectric layer to expose the barrier layer.

6. The method of claim 1, further comprising stripping the photoresist film.

7. The method of claim 1, wherein the device contact openings for each of the at least two transistor devices define respective gate contacts.

8. The method of claim 1, wherein the device contact openings comprise a pair of device contact openings for each of the at least two transistor devices that define respective drain and source ohmic contacts.

9. The method of claim 8, wherein the photoresist serves as an etch stop for the etching of the metal layer.

10. The method of claim 9, wherein the step of etching the metal layer further comprises defining respective metal spaces between the drain and source ohmic contacts of each device.

11. The method of claim 1, wherein the GaN layer is un-doped and comprises a thickness between 0.5 and 10 µm.

12. The method of claim 1, wherein the barrier layer is un-doped and comprises a thickness between 50 Å to 300 Å.

13. The method of claim 12, wherein the barrier layer comprises AlGaN with an Al composition ratio between 10% and 35% of the AlGaN.

14. A method of forming a transistor device, the method comprising:
    forming a buffer layer on a substrate;
    forming a GaN layer over the buffer layer;
    forming a barrier layer over the GaN layer;
    forming a dielectric layer over the barrier layer;
    forming at least one device contact opening and an isolation contact opening in the dielectric layer;
    forming a metal layer over the dielectric layer, the at least one device contact opening and the isolation contact opening;
    forming a photoresist film above the at least one device contact opening, the photoresist film defining a metal mask window;
    etching the metal layer and, as part of the same metal layer etching step,
    etching a portion of the barrier layer and the GaN layer to form an isolation region where the metal mask window and isolation contact opening overlap.

15. The method of claim 14, wherein the isolation contact opening is wider than the metal mask window.

16. The method of claim 14, wherein the metal mask window is wider than the isolation contact opening.

17. The method of claim 14, wherein the step of forming the at least one device contact opening and the isolation contact opening in the dielectric layer comprises etching the dielectric layer to expose the barrier layer.

18. The method of claim 14, further comprising stripping the photoresist film.

19. The method of claim 14, wherein the at least one device contact opening defines a gate contact for the transistor device.

20. The method of claim 14, wherein the at least one device contact opening comprise a pair of device contact openings that define respective drain and source ohmic contacts for the transistor device.

21. The method of claim 20, wherein the photoresist serves as an etch stop for the etching of the metal layer.

22. The method of claim 21, wherein the step of etching the metal layer further comprises defining respective metal spaces between the drain and source ohmic contacts of each device.

* * * * *